United States Patent
Park

(10) Patent No.: US 7,499,350 B2
(45) Date of Patent: Mar. 3, 2009

(54) SENSE AMPLIFIER ENABLE SIGNAL GENERATOR FOR SEMICONDUCTOR MEMORY DEVICE

(75) Inventor: Byoung-Kwon Park, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 80 days.

(21) Appl. No.: 11/819,798

(22) Filed: Jun. 29, 2007

(65) Prior Publication Data

US 2008/0159024 A1    Jul. 3, 2008

(30) Foreign Application Priority Data

Dec. 27, 2006    (KR) ...................... 10-2006-0134371

(51) Int. Cl.
*G11C 7/00* (2006.01)
*G11C 7/02* (2006.01)
*G11C 7/10* (2006.01)

(52) U.S. Cl. ............. 365/196; 365/189.02; 365/189.11; 365/194; 365/203; 365/207

(58) Field of Classification Search ............ 365/189.02, 365/189.11, 194, 196, 203, 207
See application file for complete search history.

(56) References Cited

U.S. PATENT DOCUMENTS

| | | | |
|---|---|---|---|
| 5,966,337 A | 10/1999 | Lee et al. | |
| 6,043,685 A | 3/2000 | Lee | |
| 6,088,292 A * | 7/2000 | Takahashi | ............... 365/233.14 |
| 6,097,653 A | 8/2000 | Park | |
| 6,178,517 B1 * | 1/2001 | Bertin et al. | ................ 713/324 |
| 6,347,058 B1 | 2/2002 | Houghton et al. | |
| 6,952,374 B2 * | 10/2005 | Lee | ............................ 365/207 |
| 7,002,862 B2 | 2/2006 | Kang | |
| 2004/0240293 A1 * | 12/2004 | Lee | ............................ 365/208 |
| 2006/0034139 A1 * | 2/2006 | Shim | ..................... 365/230.03 |
| 2006/0111865 A1 | 5/2006 | Choi | |

FOREIGN PATENT DOCUMENTS

| | | |
|---|---|---|
| JP | 10-340583 | 12/1998 |
| JP | 2002-230978 | 8/2002 |
| KR | 10-054633 | 1/2005 |

OTHER PUBLICATIONS

Korean Notice of Allowance issued in Korean Patent Application No. KR 10-2006-0134371 dated on Apr. 30, 2008.

* cited by examiner

*Primary Examiner*—Ly D Pham
(74) *Attorney, Agent, or Firm*—McDermott Will & Emery LLP

(57) ABSTRACT

A semiconductor memory device includes a bit line sense amplifier, a sense amplifier enable signal generator, a power line driver, and a driver controller. The bit line sense amplifier senses and amplifies data carried on a bit line. The sense amplifier enable signal generator generates a sense amplifier enable signal in response to an active command signal and a precharge command signal. Activation points of times of the sense amplifier enable signal corresponding to the active command signal are multiplexed depending on input/output bandwidth option information. The power line driver drives a pull-up power line and a pull-down power line of the bit line sense amplifier. The driver controller controls the power line driver in response to the sense amplifier enable signal.

11 Claims, 6 Drawing Sheets

SENSE AMPLIFIER ENABLE SIGNAL GENERATOR FOR SEMICONDUCTOR MEMORY DEVICE

CROSS-REFERENCE TO RELATED APPLICATION

The present invention claims priority of Korean patent application number 10-2006-0134371, filed on Dec. 27, 2006, which is incorporated by reference in its entirety.

BACKGROUND OF THE INVENTION

The present invention relates to semiconductor design technologies; and, more particularly, to a sense amplifier for use in a semiconductor memory device. More specifically, the present invention is directed to a sense amplifier enable signal generator for controlling the sense amplifier of the semiconductor memory device.

Generally, a memory device such as DRAM (Dynamic Random Access Memory) is provided with a bit line sense amplifier for amplifying a fine potential difference of a pair of bit lines for read or refresh driving.

For reference, the procedure of outputting data stored in cells through a read operation in DRAM will be described around the operation of such a bit line sense amplifier as follows.

First, when an RAS signal /RAS among external commands for operating DRAM is activated, an input address signal is applied to a row address buffer which performs a row decoding operation wherein the row address signal is decoded to select a word line to which a cell where a data to be outputted is stored belongs.

In this manner, when a word line is selected and at the same time a data of a plurality of cells coupled to the selected word line is carried on plural pairs of bit lines BL and BLB, the bit line sense amplifier is driven to amplify the data of the plural pairs of bit lines BL and BLB.

Next, any one of the plural pairs of bit lines BL and BLB is selected by a column address by a column decoder and the data of the selected pair of bit lines BL and BLB is outputted through a segment input/output line SIO, a local input/output line LIO and a global input/output line GIO.

Meanwhile, a sense amplifier enable signal used herein denotes a signal for determining when a sense amplifier amplifies the data carried on the pair of bit lines BL and BLB by the selected word line in such a read operation of DRAM. Typically, such a sense amplifier enable signal is generated by the following method.

FIG. 1 is a circuit diagram showing a configuration of a bit line sense amplifier array and a memory cell array including a sense amplifier enable signal generator of DRAM according to the prior art.

Referring to FIG. 1, the memory cell array 140 includes a plurality of word lines WL0, WL1, WL2 and WL3, and a sub word driver for driving the plurality of word lines WL0, WL1, WL2 and WL3.

Although one cell is shown to be configured for one word line in FIG. 1, it is merely for simplicity of drawing and a plurality of cells are generally arranged for one word line.

Further, even if the memory cell array 140 is configured only above the bit line sense amplifier array in the drawing, it is usually provided above and below the bit line sense amplifier array.

Typically, therefore, the memory cell array above the bit line sense amplifier array is called an 'upper memory cell array' and the memory cell array below the bit line sense amplifier array is called a 'lower memory cell array'.

The bit line sense amplifier array is provided with a bit line sense amplifier 130, an upper bit line separator 150 and a lower bit line separator 180, a bit line equalization/precharge part 160, a column selector 170, a bit line sense amplifier power line driver 120 and a driver controller 110, (regardless of the sense amplifier enable signal generator 100.)

The driver controller 110 drives a pull-down power line SB and a pull-up power line RTO for controlling the operation of the power line driver 120 with a predetermined voltage level in response to a sense amplifier enable signal SAE outputted from the sense amplifier enable signal generator 100.

The upper bit line separator 150 is to separate/connect the upper memory cell array from/to the bit line sense amplifier 130 in response to an upper separation signal BISH, and the lower bit line separator 180 is to separate/connect the lower memory cell array from/to the bit line sense amplifier 130 in response to a lower separation signal BISH.

The bit line sense amplifier 130 senses a voltage difference (having a fine voltage difference by charge sharing) of a pair of bit lines BL and BLB when the sense amplifier enable signal SAE is activated so that the pull-down power line SB and the pull-up power line RTO are driven to a predetermined voltage level by the driver controller 110, and then amplifies one of the bit lines to a ground voltage VSS and the other to a core voltage VCORE.

The bit line equalization/precharge part 160 serves to precharge the pair of bit lines BL and BLB to a bit line precharge voltage VBLP (conventionally, VCORE/2) in response to a bit line equalization signal BLEQ, after completing the sensing/amplification and restoration procedure for the bit lines.

The column selector 170 transfers the data of the pair of bit lines BL and BLB sensed/amplified by the bit line sense amplifier 130 to segment data buses SIO and SIOB in response to a column selection signal YI when a read command is applied thereto.

Meanwhile, the sense amplifier enable signal generator 100 is provided with a default delay circuit 102 and a sense amplifier enable signal output circuit 104.

The default delay circuit 102 delays an active command signal ACT activated in response to an RAS signal /RAS by a predetermined sensing delay to output a sense amplifier activation control signal SAEA.

The sense amplifier enable signal output circuit 104 activates the sense amplifier enable signal SAE in response to the sense amplifier activation control signal SAEA and inactivates the same in response to a precharge command signal PCG.

FIG. 2 is a timing diagram illustrating the sensing and amplifying procedure of the bit line sense amplifier including the sense amplifier enable signal generator shown in FIG. 1.

Referring to FIG. 2, the bit line sense amplifier 130 senses and amplifies the data of the pair of bit lines BL and BLB through the following steps.

First of all, a word line WL to which a cell where a data to be outputted is stored belongs is activated in response to the active command signal ACT activated by the row decoding operation set forth above.

When the word line Wl is activated, a fine voltage difference occurs between the pair of bit lines BL and BLB due to a charge sharing phenomenon in which the data of the cell belonging to the word line is transferred to the pair of bit lines BL and BLB.

Thereafter, when the sense amplifier enable signal SAE is activated in response to the signal SAEA that is obtained by delaying the active command signal ACT used in activating the word line WL by a predetermined sensing delay, the bit line sense amplifier 130 senses a fine voltage difference of the pair of bit lines BL and BLB and amplifies one of them to the ground voltage VSS and the other to the core voltage VCORE.

By the way, the sense amplifier enable signal generator 100 mentioned above delays the active command signal ACT used in activating the word line WL by a predetermined sensing delay which is a fixed delay value regardless of the input/output bandwidth of DRAM, and employs it in activating the sense amplifier enable signal SAE.

In case the sense amplifier enable signal SAE is activated by using the fixed delay value as above, some problems may be generated as follows.

FIG. 3 is a diagram showing word lines of banks activated correspondingly to an input/output bandwidth.

Referring to FIG. 3, the number of word lines of banks activated correspondingly to an input/output bandwidth can be seen.

First, an IO<0:7> line is connected to a bank BANK0_0, an IO<8:15> line is connected to a bank BANK0_1, an IO<16:24> line is connected to a bank BANK0_2, and an IO<25:32> line is connected to a bank BANK0_3.

That is, in the input/output bandwidth of X8, one of IO<0:7>, IO<8:15>, IO<16:24>, and IO<25:32> lines is enabled in one input/output operation and only one of BANK0_0, BANK0_1, BANK0_2, and BANK0_3 regions is selected, and thus, only one word line is activated in one input/output operation.

Further, in the input/output bandwidth of X16, two of IO<0:7>, IO<8:15>, IO<16:24>, and IO<25:32> lines are enabled in one input/output operation and two of BANK0_0, BANK0_1, BANK0_2, and BANK0_3 regions are selected, and thus, two word lines are activated in one input/output operation.

Also, in the input/output bandwidth of X32, all of IO<0:7>, IO<8:15>, IO<16:24>, and IO<25:32> lines are enabled in one input/output operation and all of BANK0_0, BANK0_1, BANK0_2 and BANK0_3 regions are selected, and thus, four word lines are activated in one input/output operation.

Therefore, it can be seen that the number of word lines activated in one input/output operation increases as the input/output bandwidth increases.

By the way, if the number of word lines activated in one input/output operation increases, the amount of current consumed by DRAM in one input/output operation increases, which causes a phenomenon in which a voltage level used therein becomes lower than a desired level.

Thus, the bit line sense amplifier 130 may involve the following problems by the aforementioned phenomenon that also occurs in the sense amplifier enable signal generator 100 that is one of voltages used in the DRAM.

FIG. 4A is a timing diagram illustrating one example of defects which may happen due to malfunctioning of the sense amplifier enable signal generator of the semiconductor memory device according to the prior art in the sensing and amplifying procedure of the bit line sense amplifier shown in FIG. 1.

Referring to FIG. 4A, when a predetermined sensing delay of the sense amplifier enable signal generator 100 is fixed so that the bit line sense amplifier 130 is optimized in the input/output bandwidth of X8 and operated, a solid line represents an operation waveform of the bit line sense amplifier 130 that operates in the input/output bandwidth of X8, and a dotted line denotes an operation waveform of the bit line sense amplifier 130 that operates in the input/output bandwidth of X32.

With reference to the solid line, the bit line sense amplifier 130 that operates in the input/output bandwidth of X8 normally amplifies the data of the pair of bit lines BL and BLB without any problem, like that shown in FIG. 2.

However, with reference to the dotted line, the bit line sense amplifier 130 that operates in the input/output bandwidth of X32 may cause a problem that a fine voltage level difference that has to be occurred between the pair of bit lines BL and BLB becomes less than a voltage level difference that can be sensed by the bit line sense amplifier 130 because of a late occurrence of a charge sharing phenomenon in which the data of cell belonging to the word line is transferred to the pair of bit lines BL and BLB due to a gentle slope of the word line WT activated in response to the active command signal ACT.

As such, if the fine voltage level difference between the pair of bit lines BL and BLB becomes less than the voltage level difference that can be sensed by the bit line sense amplifier 130, there may occur a defect that the bit line sense amplifier 130 inversely senses and amplifies the data as shown.

FIG. 4B is a timing diagram illustrating another example of defects which may happen due to malfunctioning of the sense amplifier enable signal generator of the semiconductor memory device according to the prior art in the sensing and amplifying procedure of the bit line sense amplifier shown in FIG. 1.

Referring to FIG. 4B, when the predetermined sensing delay of the sense amplifier enable signal generator 100 is fixed so that the bit line sense amplifier 130 is optimized in the input/output bandwidth of X32 and operated, a solid line represents an operation waveform of the bit line sense amplifier 130 that operates in the input/output bandwidth of X32, and a dotted line denotes an operation waveform of the bit line sense amplifier 130 that operates in the input/output bandwidth of X8.

With reference to the solid line, the bit line sense amplifier 130 that operates in the input/output bandwidth of X32 normally amplifies the data of the pair of bit lines BL and BLB without any problem, like that shown in FIG. 2.

However, with reference to the dotted line, the bit line sense amplifier 130 that operates in the input/output bandwidth of X8 may raise a problem that an operation speed of the entire DRAM including the bit line sense amplifier 130 becomes slow because the sense amplifier enable signal SAE is activated to operate the bit line sense amplifier 130 at a certain time after an occurrence of a charge sharing phenomenon in which the data of cell belonging to the word line is transferred to the pair of bit lines BL and BLB due to a sharp slope of the word line WL activated in response to the active command signal ACT.

In addition, in order to solve the aforementioned problem caused by variation of a target input/output bandwidth of DRAM in its design, the conventional method modifies an inner circuit configuration of DRAM, but this increases costs and takes time for development.

SUMMARY OF THE INVENTION

Embodiments of the present invention are directed to providing a semiconductor memory device with a reliable bit line sense amplifier.

In accordance with an aspect of the present invention, there is provided a semiconductor memory device including a bit line sense amplifier, a sense amplifier enable signal generator, a power line driver, and a driver controller. The bit line sense amplifier senses and amplifies data carried on a bit line. The sense amplifier enable signal generator generates a sense amplifier enable signal in response to an active command signal and a precharge command signal. Activation points of times of the sense amplifier enable signal corresponding to the active command signal are multiplexed depending on input/output bandwidth option information. The power line driver drives a pull-up power line and a pull-down power line of the bit line sense amplifier. The driver controller controls the power line driver in response to the sense amplifier enable signal In accordance with another aspect of the present invention, there is provided a sense amplifier enable signal generator for a semiconductor memory device including a default delay circuit, an auxiliary delay circuit, and a sense amplifier enable signal output circuit. The default delay circuit delays an active command signal by a predetermined sensing delay time. The auxiliary delay circuit selectively delays an output signal of the default delay circuit based on input/output bandwidth option information. The sense amplifier enable signal output circuit outputs a sense amplifier enable signal in response to an output signal of the auxiliary delay circuit and a precharge command signal.

DESCRIPTION OF SPECIFIC EMBODIMENTS

Hereinafter, a preferred embodiment of the present invention will be described in detail with reference to the accompanying drawings. However, the present invention is not limited to the embodiment set forth below but may be implemented in different ways. The embodiment illustrated below is merely for full disclosure of the present invention and also for those skilled in the art to fully know the scope of the present invention.

Figure 1:
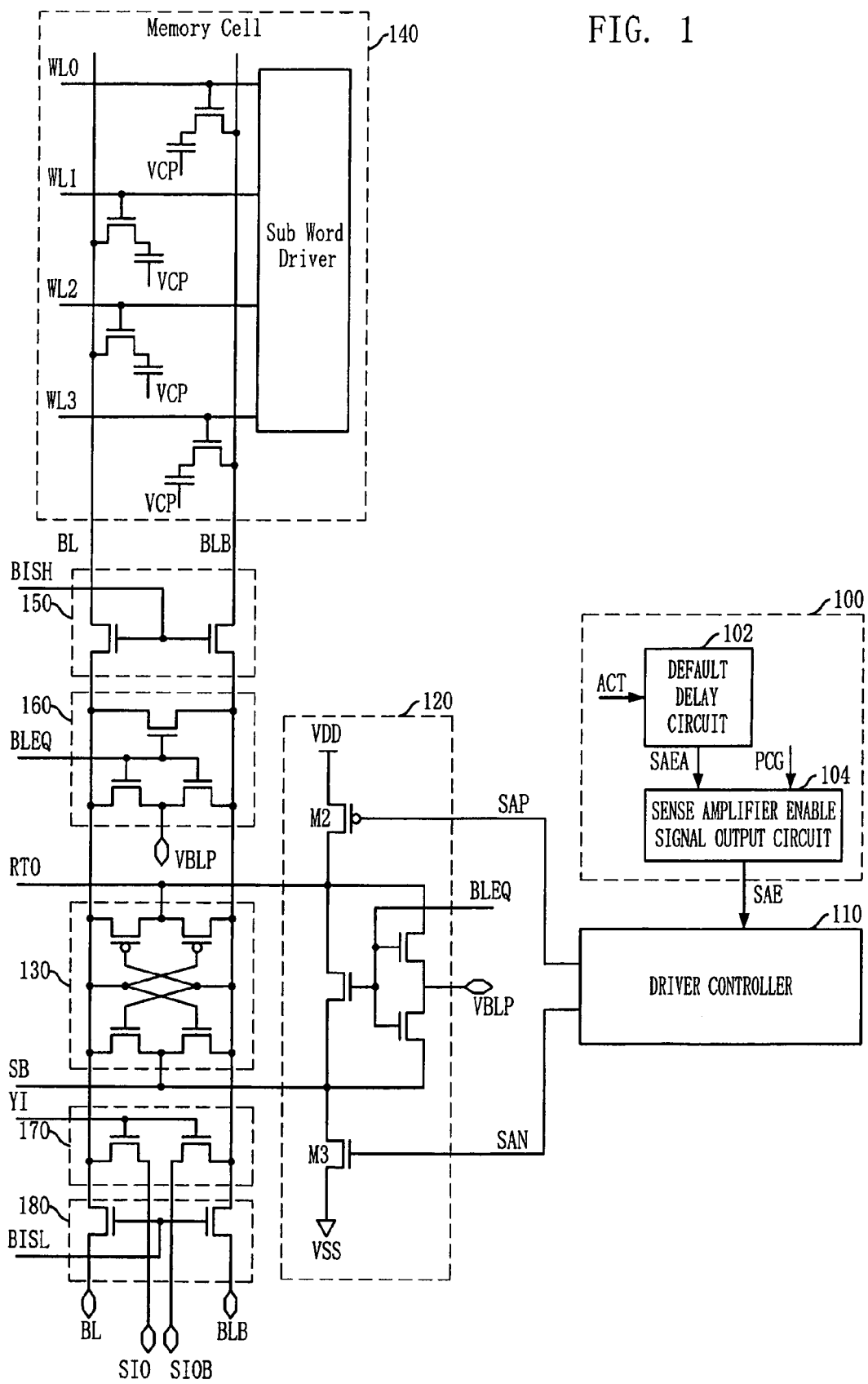
FIG. 1 is a circuit diagram showing a configuration of a bit line sense amplifier array and a memory cell array including a sense amplifier enable signal generator of DRAM according to the prior art.
Figure 2:
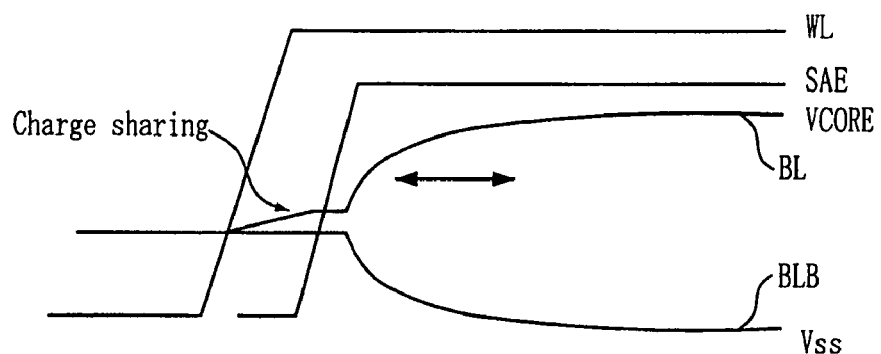
FIG. 2 is a timing diagram illustrating a sensing and amplifying procedure of a bit line sense amplifier including the sense amplifier enable signal generator shown in FIG. 1.
Figure 3:
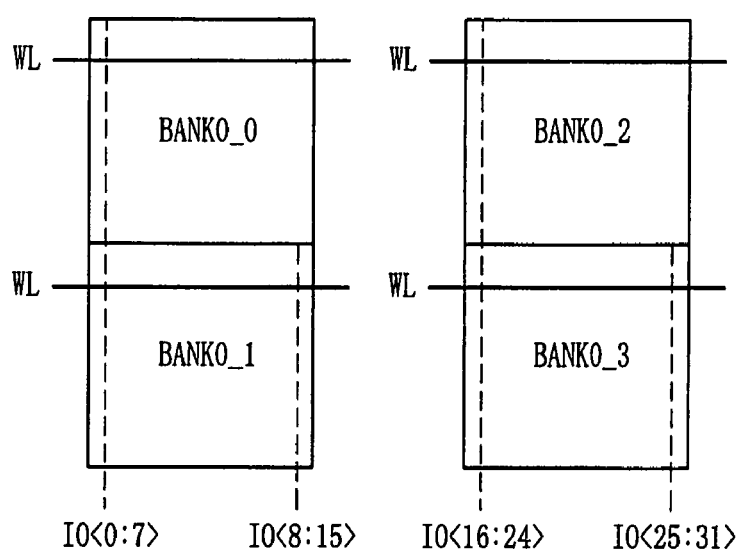
FIG. 3 is a diagram showing word lines of banks activated correspondingly to an input/output bandwidth.
Figure 4A:
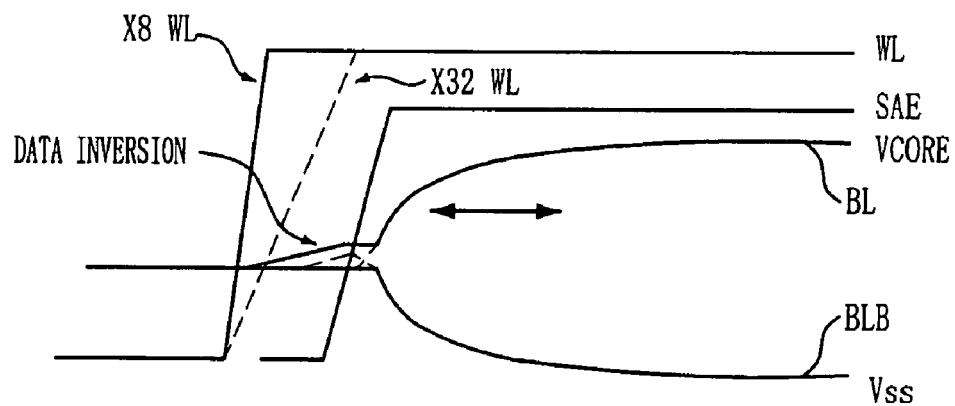
FIG. 4A is a timing diagram illustrating one example of defects which may occur due to malfunctioning of the sense amplifier enable signal generator of the semiconductor memory device according to the prior art in the sensing and amplifying procedure of the bit line sense amplifier shown in FIG. 1.
Figure 4B:
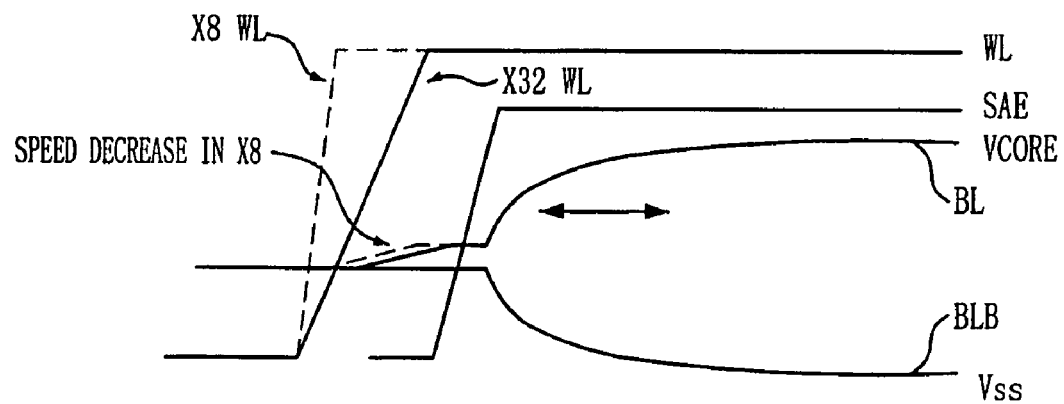
FIG. 4B is a timing diagram illustrating another example of defects which may occur due to malfunctioning of the sense amplifier enable signal generator of the semiconductor memory device according to the prior art in the sensing and amplifying procedure of the bit line sense amplifier shown in FIG. 1.
Figure 5:
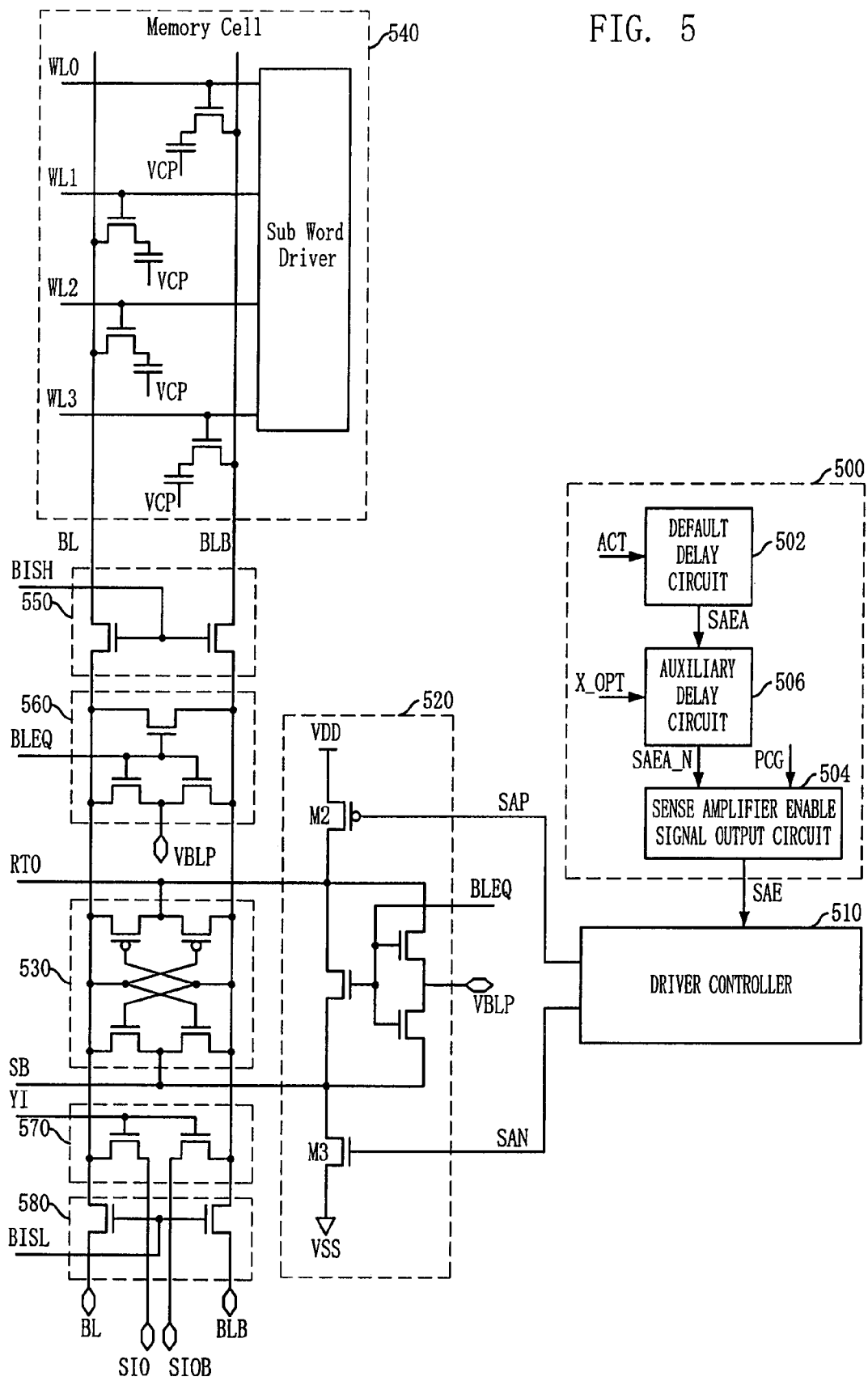
FIG. 5 is a circuit diagram illustrating a configuration of a bit line sense amplifier array and a memory cell array including a sense amplifier enable signal generator of DRAM in accordance with a preferred embodiment of the present invention.

FIG. 5 is a circuit diagram illustrating a configuration of a bit line sense amplifier array and a memory cell array including a sense amplifier enable signal generator of DRAM in accordance with a preferred embodiment of the present invention.

Referring to FIG. 5, the memory cell array 540 includes a plurality of word lines WL0, WL1, WL2 and WL3, and a sub word driver for driving the plurality of word lines WL0, WL1, WL2 and WL3.

The bit line sense amplifier array is provided with a bit line sense amplifier 530, an upper bit line separator 550 and a lower bit line separator 580, a bit line equalization/precharge part 560, a column selector 570, a bit line sense amplifier power line driver 520 and a driver controller 510, regardless of a sense amplifier enable signal generator 500.

Since the configuration of the memory cell array 540 and the bit line sense amplifier array is described in the prior art section, only the sense amplifier enable signal generator 500 having components different from the prior art will be explained here.

Referring to FIG. 5, the sense amplifier enable signal generator 500 generates a sense amplifier enable signal SAE in response to an active command signal ACT and a precharge command signal PCG, and is a circuit which multiplexes activation points of time of the sense amplifier enable signal SAE corresponding to the active command signal ACT according to input/output bandwidth option information X_OPT and outputs the result. The sense amplifier enable signal generator 500 includes a default delay circuit 502 for delaying the active command signal ACT by a predetermined sensing delay, an auxiliary delay circuit for selectively delaying an output signal of the default delay circuit 502 based on the input/output bandwidth option information X_OPT to output a delayed signal, and a sense amplifier enable signal output circuit 504 for outputting the sense amplifier enable signal SAE in response to an output signal SAEA_N of the auxiliary delay circuit 506 and the precharge command signal PCG.

Figure 6:
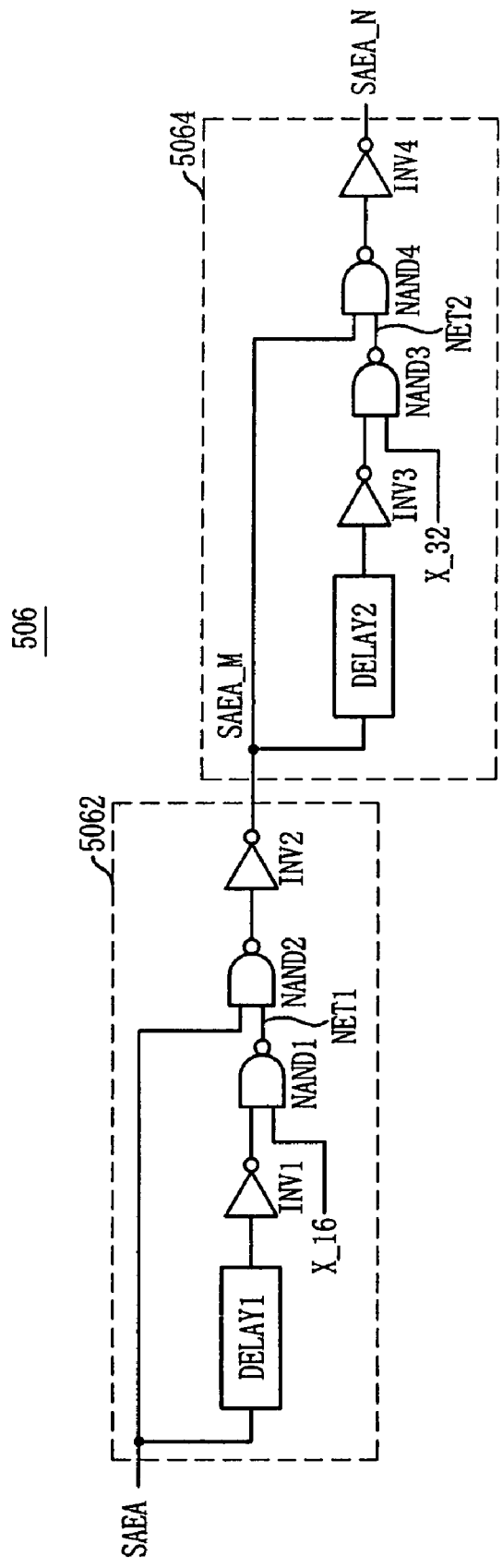
FIG. 6 is a detailed circuit diagram of the auxiliary delay circuit among the components of the sense amplifier enable signal generator of DRAM in accordance with the present invention shown in FIG. 5.

FIG. 6 is a detailed circuit diagram of the auxiliary delay circuit among the components of the sense amplifier enable signal generator of DRAM in accordance with the present invention shown in FIG. 5.

Referring to FIG. 6, the auxiliary delay circuit 506 of the present invention is provided with a first delay selector 5062 for selectively delaying the output signal SAEA of the default delay circuit 502 by a first preset time period in response to a first input/output bandwidth option information signal X_16 to output a delayed signal SAEA_M, and a second delay selector 5064 for selectively delaying an output signal of the first delay selector 5062 by a second preset time period in response to a second input/output bandwidth option information signal X_32 to provide a delayed signal SAEA_N.

The first delay selector 5062 is composed of a delay circuit DELAY1 for delaying the output signal SAEA of the default delay circuit 502 by the first preset time period, a first inverter INVL for inverting an output signal of the delay circuit DELAY1, a first NAND gate NAND1 for NAND-operating on an output signal of the first inverter INVL and the first input/output bandwidth option information signal X_16, a second NAND gate NAND2 for NAND-operating on an output signal SAEA of the default delay circuit 502 and an output signal of the first NAND gate NAND1, and a second inverter INV2 for inverting an output signal of the second NAND gate NAND2 to output an inverted signal SAEA_M.

The second delay selector 5064 is composed of a delay circuit DELAY2 for delaying the output signal SAEA_M of the first delay selector 5062 by the second preset time period, a first inverter INV3 for inverting an output signal of the delay circuit DELAY2, a first NAND gate NAND3 for NAND-operating on an output signal of the first inverter INV3 and the second input/output bandwidth option information signal X_32, a second NAND gate NAND4 for NAND-operating on the output signal SAEA_M of the first delay selector 5062 and an output signal of the first NAND gate NAND3, and a second inverter INV4 for inverting an output signal of the second NAND gate NAND4 to provide an inverted signal SAEA_N.

Now, an operation of the sense amplifier enable signal generator 500 will be described below based on the configuration mentioned above.

First, as illustrated in the prior art section, it can be seen that if the input/output bandwidth is relatively increased, the slope of the word line WL activated in response to the active command signal ACT becomes relatively gentle, and if the input/output bandwidth is relatively decreased, the slope of word line WL activated in response to the active command signal ACT becomes relatively sharp.

Therefore, if the input/output bandwidth is relatively increased, the sense amplifier enable signal SAE should be activated relatively late, and if the input/output bandwidth is relatively decreased, the sense amplifier enable signal SAE should be activated relatively fast.

Because of this, the components of the sense amplifier enable signal generator 500 of the present invention are operated as follows.

First of all, the default delay circuit 502 delays the active command signal ACT by a predetermined sensing delay time that is optimized so that the bit line sense amplifier 530 operates in the input/output bandwidth of DRAM in which the smallest number of word lines is activated in one input/output operation, to output the signal SAEA.

The auxiliary delay circuit 506 further delays the signal SAEA outputted from the default delay circuit 502 additionally as the input/output bandwidth increases.

In other words, the auxiliary delay circuit 506 outputs, as the signal SAEA_N, the signal SAEA from the default delay circuit 502 in the input/output bandwidth of DRAM in which the smallest number of word lines is activated in one input/output operation, without further delay thereof. However, if several word lines are activated in one input/output operation by increase of the input/output bandwidth, the auxiliary delay circuit 506 further delays the signal SAEA outputted from the default delay circuit 502 additionally to output the signal SAEA_N.

For example, if the input/output bandwidth of DRAM in which the smallest number of word lines is activated in one input/output operation is the input/output bandwidth of X8, the signal SAEA_N outputted from the auxiliary delay circuit 506 and the signal SAEA from the default delay circuit 502 are activated at the same point of time when the DRAM operates in the input/output bandwidth of X8.

However, when the DRAM operates in the input/output bandwidth of X32, the signal SAEA_N outputted from the auxiliary delay circuit 506 is activated later than the signal SAEA from the default delay circuit 502.

Figure 7:
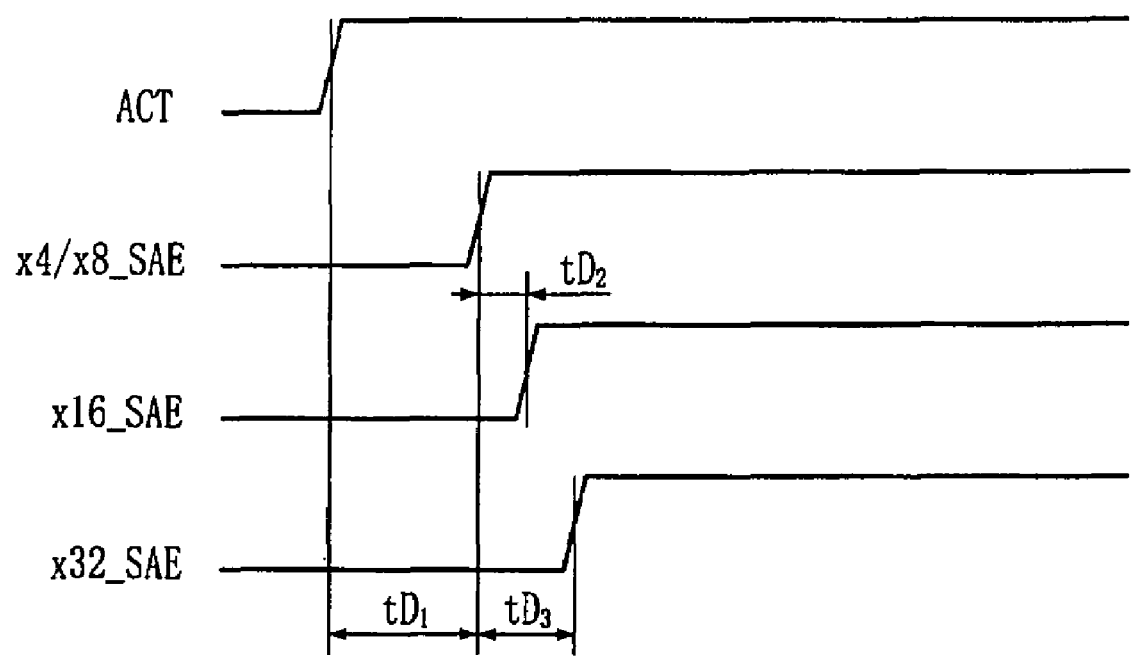
FIG. 7 is a diagram showing a comparison of variations of an activation point of time of the sense amplifier enable signal which are done after the active command signal is activated by variation of the input/output bandwidth in DRAM to which the sense amplifier enable signal generator of the present invention is applied.

FIG. 7 is a diagram showing a comparison of variations of an activation point of time of the sense amplifier enable signal which are done after the active command signal is activated by variation of the input/output bandwidth in DRAM to which the sense amplifier enable signal generator of the present invention is applied.

Referring to FIG. 7, it can be seen that the sense amplifier enable signal SAE is activated after a predetermined sensing delay time tD1 in response to activation of the active command signal ACT in the input/output bandwidth of X4/X8 in which the smallest number of word lines is activated in one input/output operation.

However, it can be seen that the sense amplifier enable signal SAE is activated after further delaying a certain delay time tD2 in addition to the predetermined sensing delay time tD1 in the input/output bandwidth of X16 in which the word lines more than those of the input/output bandwidth of X4/X8 are activated in one input/output operation.

Further, it can also be seen that the sense amplifier enable signal SAE is activated after further delaying a certain delay time tD3 greater than delay time tD2 in the input/output bandwidth of X16 in addition to the predetermined sensing delay time tD1 in the input/output bandwidth of X32 in which the word lines more than those of the input/output bandwidth of X16 are activated in one input/output operation.

As discussed above, with the embodiment of the present invention, even in case a target input/output bandwidth of DRAM in its design varies, it is possible to prevent defects that occur in the bit line sensing and amplifying procedure by variation of activation point of time of the sense amplifier enable signal SAE correspondingly to variation of the input/output bandwidth.

Additionally, the inner circuit configuration does not need to be changed relative to variation of the input/output bandwidth, thereby leading to reduction in a time period and costs required for development.

It should be noted that the logic gates and transistors illustrated in the aforementioned embodiment may be implemented in different types and arrangements based on the polarities of input signals.

As a result, the present invention activates the sense amplifier enable signal SAE at a stable point of time in response to the active command signal ACT regardless of variation of the input/output bandwidth of DRAM, thereby preventing degradation of operation characteristic of the bit line sense amplifier and also decreasing defects.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
  a bit line sense amplifier for sensing and amplifying data carried on a bit line;
  a sense amplifier enable signal generator for generating a sense amplifier enable signal in response to an active command signal and a precharge command signal, wherein activation point the sense amplifier enable signal is multiplexed depending on input/output bandwidth option information;
  a power line driver for driving a pull-up power line and a pull-down power line of the bit line sense amplifier; and
  a driver controller for controlling the power line driver in response to the sense amplifier enable signal.

2. The semiconductor memory device as recited in claim 1, wherein the sense amplifier enable signal generator includes:
  a default delay circuit for delaying the active command signal by a predetermined sensing delay time;
  an auxiliary delay circuit for selectively delaying an output signal of the default delay circuit based on the input/output bandwidth option information; and a sense amplifier enable signal output circuit for outputting the sense amplifier enable signal in response to an output signal of the auxiliary delay circuit and the precharge command signal.

3. The semiconductor memory device as recited in claim 2, wherein the auxiliary delay circuit selectively delays an output signal of the default delay circuit by a relatively large time period if the input/output bandwidth information has a relatively large value, and selectively delays an output signal of the default delay circuit by a relatively small time period if the input/output bandwidth information has a relatively small value.

4. The semiconductor memory device as recited in claim 2, wherein the auxiliary delay circuit includes:
   a first delay selector for selectively delaying an output signal of the default delay circuit by a first predetermined time period in response to a first input/output bandwidth option information signal; and
   a second delay selector for selectively delaying an output signal of the first delay selector by a second predetermined time period in response to a second input/output bandwidth option information signal.

5. The semiconductor memory device as recited in claim 4, wherein the first delay selector includes:
   a delay circuit for delaying the output signal of the default delay circuit by the first predetermined time period;
   a first inverter for inverting an output signal of the delay circuit;
   a first NAND gate for NAND-operating on an output signal of the first inverter and the first input/output bandwidth option information signal;
   a second NAND gate for NAND-operating on an output signal of the default delay circuit and an output signal of the first NAND gate; and
   a second inverter for inverting an output signal of the second NAND gate.

6. The semiconductor memory device as recited in claim 4, wherein the second delay selector includes:
   a delay circuit for delaying the output signal of the first delay selector by the second predetermined time period;
   a first inverter for inverting an output signal of the delay circuit;
   a first NAND gate for NAND-operating on an output signal of the first inverter and the second input/output bandwidth option information signal;
   a second NAND gate for NAND-operating on an output signal of the first delay selector and an output signal of the first NAND gate; and
   a second inverter for inverting an output signal of the second NAND gate.

7. A sense amplifier enable signal generator for a semiconductor memory device, comprising:
   a default delay circuit for delaying an active command signal by a predetermined sensing delay;
   an auxiliary delay circuit for selectively delaying an output signal of the default delay circuit based on input/output bandwidth option information; and
   a sense amplifier enable signal output circuit for outputting a sense amplifier enable signal in response to an output signal of the auxiliary delay circuit and a precharge command signal.

8. The sense amplifier enable signal generator as recited in claim 7, wherein the auxiliary delay circuit selectively delays an output signal of the default delay circuit by a relatively large time period if the input/output bandwidth information has a relatively large value, and selectively delays an output signal of the default delay circuit by a relatively small time period if the input/output bandwidth information has a relatively small value.

9. The sense amplifier enable signal generator as recited in claim 7, wherein the auxiliary delay circuit includes:
   a first delay selector for selectively delaying the output signal of the default delay circuit by a first predetermined time period in response to a first input/output bandwidth option information signal; and
   a second delay selector for selectively delaying an output signal of the first delay selector by a second predetermined time period in response to a second input/output bandwidth option information signal.

10. The sense amplifier enable signal generator as recited in claim 9, wherein the first delay selector includes:
    a delay circuit for delaying the output signal of the default delay circuit by the first predetermined time period;
    a first inverter for inverting an output signal of the delay circuit;
    a first NAND gate for NAND-operating on an output signal of the first inverter and the first input/output bandwidth option information signal;
    a second NAND gate for NAND-operating on an output signal of the default delay circuit and an output signal of the first NAND gate; and
    a second inverter for inverting an output signal of the second NAND gate.

11. The sense amplifier enable signal generator as recited in claim 9, wherein the second delay selector includes:
    a delay circuit for delaying the output signal of the first delay selector by the second predetermined time period;
    a first inverter for inverting an output signal of the delay circuit;
    a first NAND gate for NAND-operating on an output signal of the first inverter and the second input/output bandwidth option information signal;
    a second NAND gate for NAND-operating on an output signal of the first delay selector and an output signal of the first NAND gate; and
    a second inverter for inverting an output signal of the second NAND gate.

* * * * *